United States Patent
Otsubo (10) Patent No.: US 10,667,381 B2
(45) Date of Patent: May 26, 2020

(54) HIGH FREQUENCY MODULE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/414,004

(22) Filed: May 16, 2019

(65) Prior Publication Data

US 2019/0274212 A1 Sep. 5, 2019

Related U.S. Application Data

(63) Continuation of application No. PCT/JP2017/042966, filed on Nov. 30, 2017.

(30) Foreign Application Priority Data

Dec. 2, 2016 (JP) .................. 2016-235270

(51) Int. Cl.
*H05K 1/02* (2006.01)
*H01L 23/66* (2006.01)
(Continued)

(52) U.S. Cl.
CPC ........... *H05K 1/0216* (2013.01); *H01L 23/00* (2013.01); *H01L 23/28* (2013.01); *H01L 23/66* (2013.01);
(Continued)

(58) Field of Classification Search
CPC .. H05K 1/0216; H05K 1/0218; H05K 1/0219; H05K 1/185

See application file for complete search history.

(56) References Cited

U.S. PATENT DOCUMENTS 9,721,903 B2 * 8/2017 Lee .................. H01L 23/552
2008/0073747 A1 * 3/2008 Chao .................. H01L 21/76
257/520

(Continued)

FOREIGN PATENT DOCUMENTS

JP 2007-157891 A 6/2007
WO 2016/181954 A1 11/2016

OTHER PUBLICATIONS

International Search Report for International Application No. PCT/JP2017/042966.

(Continued)

*Primary Examiner* — Hoa C Nguyen
(74) *Attorney, Agent, or Firm* — Pearne & Gordon LLP (57) ABSTRACT

A high frequency module includes a plurality of components on an upper surface of a multilayer wiring substrate, a sealing resin layer on the upper surface of the multilayer wiring substrate, a shield wall surrounding one of the components within the sealing resin layer, and a shield film on an upper surface of the sealing resin layer. The shield film covers a portion of the upper surface of the sealing resin layer that overlaps the one of the components but not the other components viewed from a direction perpendicular to the upper surface of the multilayer wiring substrate. An upper end of the shield wall is exposed from the upper surface of the sealing resin layer to be connected to the shield film, and a lower end thereof is exposed from a lower surface of the sealing resin layer to be connected to the multilayer wiring substrate.

4 Claims, 5 Drawing Sheets

(51) Int. Cl.
*H05K 1/18* (2006.01)
*H01L 23/00* (2006.01)
*H05K 9/00* (2006.01)
*H01L 23/28* (2006.01)

(52) U.S. Cl.
CPC .......... *H05K 1/0243* (2013.01); *H05K 1/185* (2013.01); *H05K 9/00* (2013.01); *H05K 2201/0715* (2013.01); *H05K 2201/0723* (2013.01); *H05K 2201/10098* (2013.01)

(56) References Cited

U.S. PATENT DOCUMENTS

| | | |
|---|---|---|
| 2012/0217048 A1 | 8/2012 | Leahy et al. |
| 2012/0228751 A1 | 9/2012 | Song |
| 2018/0092257 A1 | 3/2018 | Otsubo et al. |

OTHER PUBLICATIONS

Written Opinion for International Application No. PCT/JP2017/042966.

* cited by examiner

PRIOR ART

HIGH FREQUENCY MODULE

This is a continuation of International Application No. PCT/JP2017/042966 filed on Nov. 30, 2017 which claims priority from Japanese Patent Application No. 2016-235270 filed on Dec. 2, 2016. The contents of these applications are incorporated herein by reference in their entireties.

BACKGROUND

Technical Field

The present disclosure relates to high frequency modules provided with shields.

Figure 5:
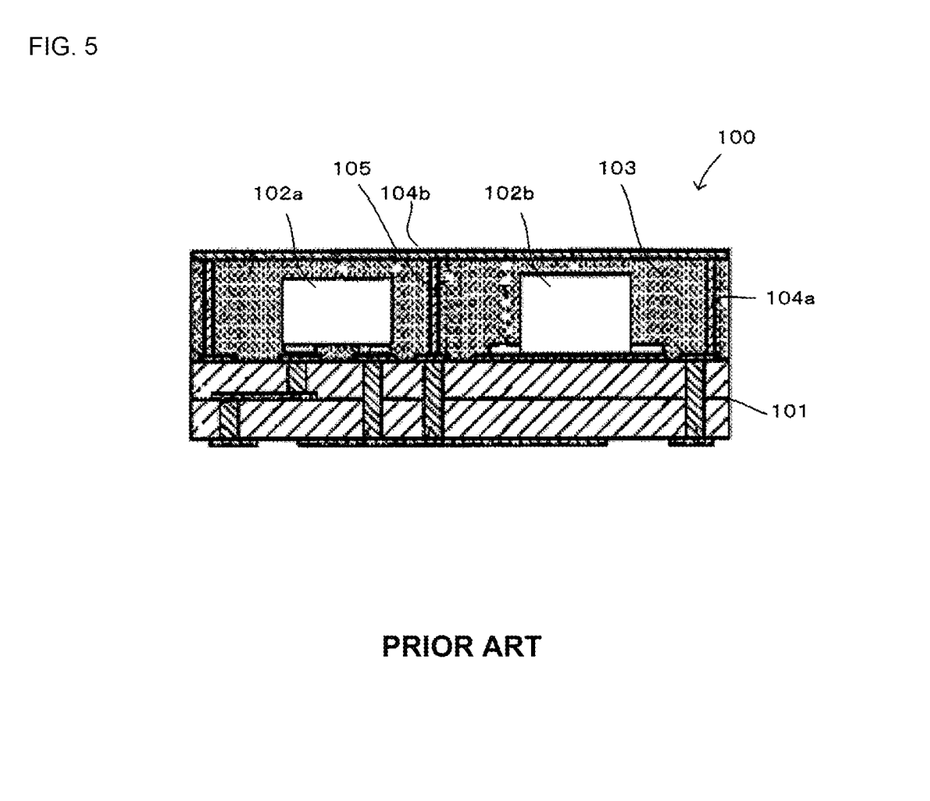
FIG. 5 is a cross-sectional view of a known high frequency module.

Some high frequency modules mounted in a mobile terminal apparatus or the like include a shield film that is formed on a surface of a resin layer for sealing a mounting component so as to prevent noise coming from the exterior from affecting the mounting component. In addition, in the case where a plurality of components is mounted, some high frequency modules have a shield provided between the components in order to prevent mutual interference of noise radiated from the components themselves. For example, as illustrated in FIG. 5, in a high frequency module 100 described in Patent Document 1, a plurality of components 102a and 102b is mounted on an upper surface of a wiring substrate 101, and each of the components 102a and 102b is sealed by a sealing resin layer 103. In this case, on the upper surface of the wiring substrate 101, a side shield plate 104a having a rectangular frame shape and surrounding the components 102a and 102b is mounted, and the side shield plate 104a is sealed together with the components 102a and 102b in the sealing resin layer 103. Further, an upper shield layer 104b is formed on an upper surface of the sealing resin layer 103, and the side shield plate 104a and the upper shield layer 104b constitute an outer shield to block unnecessary noise coming from the exterior toward the components 102a and 102b. In addition, a shield 105 is provided between the components 102a and 102b to prevent mutual interference of noise between the two components.

Patent Document 1: Japanese Unexamined Patent Application Publication No. 2007-157891 (see paragraphs 0034 to 0035, FIG. 12, and the like)

BRIEF SUMMARY

However, in the known high frequency module 100, since the side shield plate 104a is used as part of the shield, in a case where a shield is to be provided only for specific components 102a and 102b that are in need of being shielded, the specific components 102a and 102b need to be disposed near the side shield plate 104a, which raises a problem that the degree of freedom in arrangement of the components 102a and 102b is lowered.

The present disclosure has been conceived in light of the above problem, and the present disclosure provides a high frequency module capable of improving a shielding property for a specific component without necessarily impairing the degree of freedom in arrangement of the mounting components.

A high frequency module of the present disclosure includes a wiring substrate; a first component and a second component mounted on one main surface of the wiring substrate; a sealing resin layer configured to seal the one main surface of the wiring substrate, the first component, and the second component; a shield member that is so provided as to surround the first component when viewed from a direction perpendicular to the one main surface of the wiring substrate, and is disposed between the first component and the second component within the sealing resin layer; and a shield film formed on a surface of the sealing resin layer, wherein the sealing resin layer includes a contact surface in contact with the one main surface of the wiring substrate and an opposing surface opposing the contact surface; the shield film is so formed as to cover a portion of the opposing surface of the sealing resin layer that overlaps the first component but not to cover a portion thereof that overlaps the second component when viewed from the direction perpendicular to the one main surface of the wiring substrate; and one end of the shield member in a thickness direction (a direction perpendicular to the one main surface of the wiring substrate) of the sealing resin layer is exposed from the opposing surface of the sealing resin layer to be connected to the shield film, and the other end thereof in the thickness direction of the sealing resin layer is exposed from the contact surface of the sealing resin layer to be connected to an electrode formed on the one main surface of the wiring substrate.

With this configuration, the first component is surrounded by the shield member and the shield film, but the second component is not covered with the shield film. Because of this, it is possible to form a shield for the first component, and not to form a shield for the second component. Since the shield member surrounds the first component, such an arrangement restriction is not imposed that the first component needs to be disposed at a location closer to a side surface of the sealing resin layer as in the known art when a shield is to be provided only for the first component. Further, since the first component is surrounded by the shield member, mutual interference of noise between the first component and the second component can be reliably prevented. Furthermore, since the noise coming from the exterior toward the first component can be blocked by the shield film, it is possible to improve shielding characteristics of the first component.

A shield electrode formed on the other main surface of the wiring substrate may be further provided, wherein the shield electrode may be disposed at a location overlapping with the first component when viewed from the direction perpendicular to the one main surface of the wiring substrate, and the other end of the shield member may be connected to the shield electrode by a connection conductor provided in the wiring substrate.

According to this configuration, since the first component is surrounded by the shield film, the shield member, the shield electrode, and the connection conductor, it is possible to improve shielding characteristics against the noise coming from the other main surface side of the wiring substrate.

An outer electrode formed on the other main surface of the wiring substrate may be further provided, wherein an opening larger than the outer electrode may be formed in the shield electrode, and the outer electrode may be disposed in the opening.

According to this configuration, since the outer electrode can be disposed in a formation region of the shield electrode, it is possible to improve the degree of freedom in arrangement of the outer electrode.

A third component mounted on the one main surface of the wiring substrate may be further provided, wherein the third component may be surrounded together with the first component by the shield member.

According to this configuration, even in the case where there exists a plurality of components that is in need of being shielded, these components can be appropriately shielded.

According to the present disclosure, the first component is surrounded by the shield member and the shield film, but the second component is not covered with the shield film. Because of this, it is possible to form a shield for the first component, and not to form a shield for the second component. Since the shield member surrounds the first component, such an arrangement restriction is not imposed that the first component needs to be disposed at a location closer to a side surface of the sealing resin layer as in the known art when a shield is to be provided only for the first component. Further, since the first component is surrounded by the shield member, mutual interference of noise between the first component and the second component can be reliably prevented. Furthermore, since the noise coming from the exterior toward the first component can be blocked by the shield film, it is possible to improve shielding characteristics of the first component.

DETAILED DESCRIPTION

First Embodiment

Figure 1A:
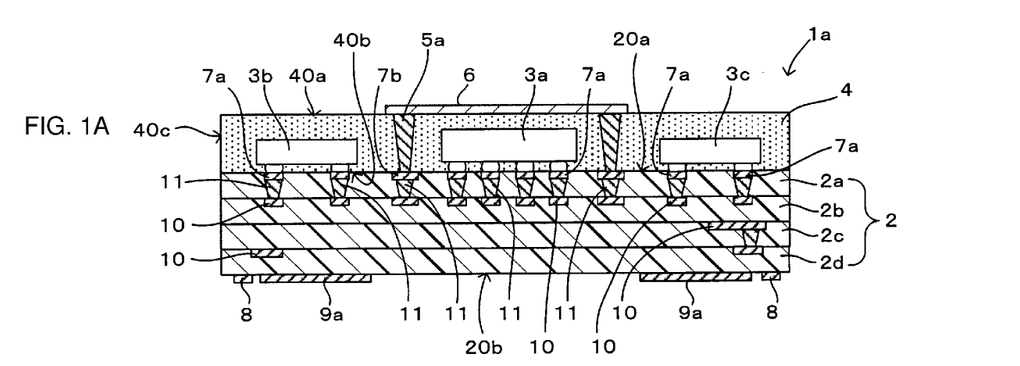
FIGS. 1A-1C include diagrams illustrating a high frequency module according to a first embodiment of the present disclosure.

A high frequency module 1a according to a first embodiment of the present disclosure will be described with reference to FIGS. 1A-1C. FIG. 1A is a cross-sectional view of the high frequency module, FIG. 1B is a plan view thereof, and FIG. 1C is a bottom view thereof.

Figure 1B:
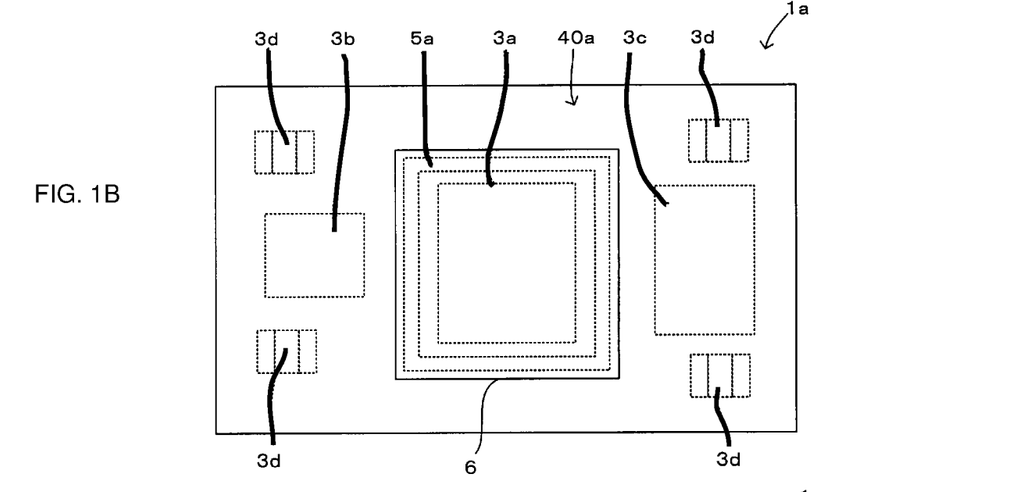
Figure 1C:
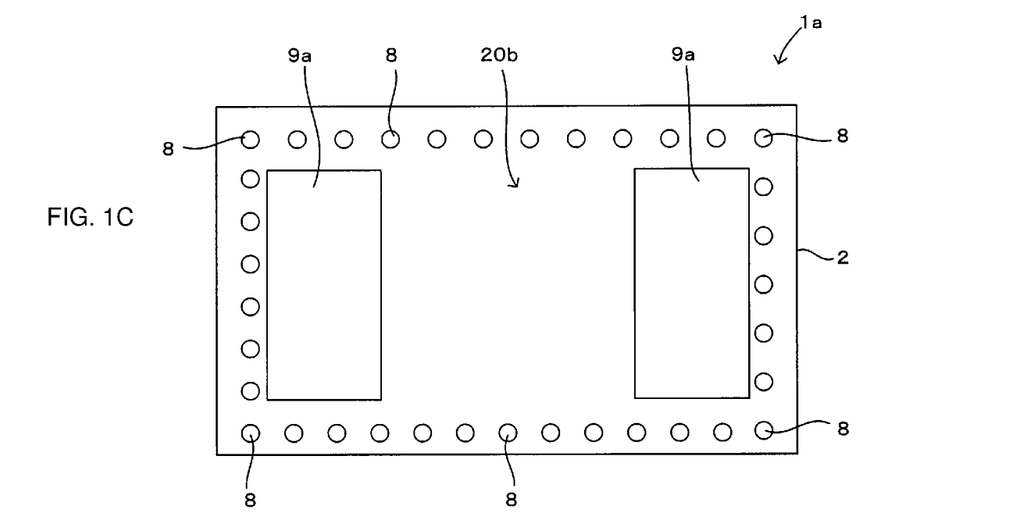

As illustrated in FIGS. 1A-1C, the high frequency module 1a according to the present embodiment includes a multilayer wiring substrate 2 (corresponding to a "wiring substrate" of the present disclosure), a plurality of components 3a to 3d mounted on an upper surface 20a of the multilayer wiring substrate 2, a sealing resin layer 4 laminated on the upper surface 20a of the multilayer wiring substrate 2, a shield film 6 covering part of an upper surface 40a of the sealing resin layer 4, and a shield wall 5a provided within the sealing resin layer 4, and is mounted on a mother substrate or the like of an electronic apparatus, for example, in which a high frequency signal is used.

The multilayer wiring substrate 2 is constituted by laminating a plurality of insulation layers 2a to 2d formed of, for example, low temperature co-fired ceramic or a glass epoxy resin. On the upper surface 20a of the multilayer wiring substrate 2 (corresponding to "one main surface of the wiring substrate" of the present disclosure), a mounting electrode 7a for mounting each of the components 3a to 3d and a surface layer conductor 7b to be connected to the shield wall 5a are formed. When viewed from a direction perpendicular to the upper surface 20a of the multilayer wiring substrate 2, the surface layer conductor 7b is formed, at a position overlapping with the shield wall 5a, in a shape having a rectangular contour to surround the component 3a; note that the shape of the surface layer conductor 7b is substantially the same as that of the shield wall 5a. A plurality of outer electrodes 8 for external connection and land electrodes 9a are formed on a lower surface 20b of the multilayer wiring substrate 2 (corresponding to "the other main surface of the wiring substrate" of the present disclosure). The land electrode 9a can be used as a ground electrode, a dummy electrode for securing mountability of the high frequency module 1a, a land electrode for heat dissipation, or the like. Various types of internal wiring electrodes 10 are formed between each of the adjacent insulation layers 2a to 2d, and a plurality of via conductors 11, which connects the internal wiring electrodes 10 formed on the different insulation layers 2a to 2d, is formed inside the multilayer wiring substrate 2.

The outer electrodes 8 are arranged in a row along a circumferential edge of the lower surface 20b of the multilayer wiring substrate 2 (see FIG. 1C). Two land electrodes 9a are each formed in a longitudinally rectangular shape, and each disposed at each end portion in a longitudinal direction of the lower surface 20b of the multilayer wiring substrate 2 formed in a horizontally-long rectangular shape. Further, each of the land electrodes 9a is connected to a ground electrode of an external mother substrate (not illustrated) by solder or the like. In the present embodiment, although no electrode is formed in a central portion of the lower surface 20b of the multilayer wiring substrate 2, an electrode for shielding may be disposed in the stated central portion.

Any of the mounting electrode 7a, the surface layer conductor 7b, the outer electrode 8, the land electrode 9a, and the internal wiring electrode 10 is formed of a metal generally employed as a wiring electrode, such as Cu, Ag, or Al. The via conductors 11 are each formed of a metal such as Ag or Cu. Note that Ni/Au plating may be applied to each of the mounting electrodes 7a, the surface layer conductor 7b, the outer electrodes 8, and the land electrodes 9a.

The components 3a to 3d are each constituted of a semiconductor device formed of a semiconductor of Si, GaAs or the like, a chip component such as a chip inductor, a chip capacitor or a chip resistor, or the like, and are mounted on the multilayer wiring substrate 2 by a commonly used surface mount technology such as solder bonding. In the present embodiment, the component 3a (corresponding to a "first component" of the present disclosure) surrounded by the shield film 6 and the shield wall 5a, and the components 3b, 3c adjacent to the component 3a are constituted of semiconductor devices. Note that the component 3a surrounded by the shield wall 5a corresponds to the "first component" of the present disclosure, and the other components 3b to 3d correspond to a "second component" of the present disclosure.

The sealing resin layer 4 covers the components 3a to 3d and the shield wall 5a and is laminated on the multilayer wiring substrate 2. The sealing resin layer 4 may be formed of a resin generally employed as a sealing resin, such as an epoxy resin. Note that the upper surface 40a of the sealing resin layer 4 corresponds to an "opposing surface of a sealing resin layer" of the present disclosure, and a lower surface 40b thereof corresponds to a "contact surface of a sealing resin layer" of the present disclosure.

When viewed from a direction perpendicular to the upper surface 20a of the multilayer wiring substrate 2, the shield wall 5a (corresponding to a "shield member" of the present disclosure) is formed in the sealing resin layer 4 in such a manner as to surround the component 3a constituted of a semiconductor device and located at the center. An upper end of the shield wall 5a in a thickness direction of the sealing resin layer 4 is exposed from the upper surface 40a of the sealing resin layer 4 and is connected to the shield film 6. A lower end of the shield wall 5a in the thickness direction of the sealing resin layer 4 is exposed from the lower surface 40b of the sealing resin layer 4 and is connected to the surface layer conductor 7b. The surface layer conductor 7b is connected to a ground electrode (not illustrated) formed on the multilayer wiring substrate 2, and the shield film 6 and the shield wall 5a are grounded by the shield wall 5a being connected to the surface layer conductor 7b. An example of a method for forming the shield wall 5a may be as follows: a groove surrounding the component 3a is formed by radiating a laser beam onto the upper surface 40a of the sealing resin layer 4, and then the groove is filled with a conductive paste, sputtering is performed, or the like.

As illustrated in FIG. 1B, the shield film 6 is formed in such a shape that, when viewed from a direction perpendicular to the upper surface 20a of the multilayer wiring substrate 2, the shield film 6 covers a region of the upper surface 40a of the sealing resin layer 4 overlapping with the component 3a, but does not cover a region thereof overlapping with the other components 3b to 3d. In this case, the shield film 6 is formed in a rectangular shape having an area larger than that of the component 3a and is disposed so that the component 3a is set within the shield film 6. Further, the shield film 6 may be formed in a multilayer structure including a close contact film laminated on the upper surface 40a of the sealing resin layer 4, a conductive film laminated on the close contact film, and a protective film laminated on the conductive film.

The close contact film is provided to increase the adhesion strength between the conductive film and the sealing resin layer 4, and may be formed of, for example, a metal such as SUS. The conductive film is a layer to play a substantial shielding function of the shield film 6 and may be formed by a metal of any of Cu, Ag, and Al, for example. The protective film is provided to prevent the conductive film from being corroded or damaged, and may be formed of, for example, stainless steel.

According to the above-discussed embodiment, the third component 3a is surrounded by the shield film 6 and the shield wall 5a, but the other components 3b to 3d are not covered with the shield film 6. Because of this, it is possible to form a shield for the component 3a that is in need of being shielded, and not to form a shield for the other components 3b to 3d that are not in need of being shielded. In addition, since the shield wall 5a surrounds the component 3a, such an arrangement restriction is not imposed that, in order to provide a shield for a specific component, the specific component needs to be disposed at a location closer to a side surface of the sealing resin layer as in the known art, whereby the degree of freedom in arrangement of the components 3a to 3d is improved. Further, by the component 3a being surrounded by the shield film 6 and the shield wall 5a, both the noise coming from the exterior and the noise radiated from the other components 3b to 3d toward the component 3a can be reliably prevented.

In a case where a shield film covering the upper surface 40a and a side surface 40c of the sealing resin layer 4 is formed by using a film forming process such as sputtering, and a portion of the shield film covering the side surface 40c of the sealing resin layer 4 is used as part of the shield of the component 3a, a film thickness of the portion of the shield film covering the side surface 40c of the sealing resin layer 4 may become thinner than a film thickness of a portion thereof covering the upper surface 40a of the sealing resin layer 4, thereby raising a risk that the shielding characteristics are degraded in this portion. However, in this embodiment, since no shield film is provided on the side surface 40c of the sealing resin layer 4, and the shield wall 5a surrounds the component 3a, the shielding characteristics are not degraded due to the film thickness being thinned during the deposition process.

Second Embodiment

Figure 2A:
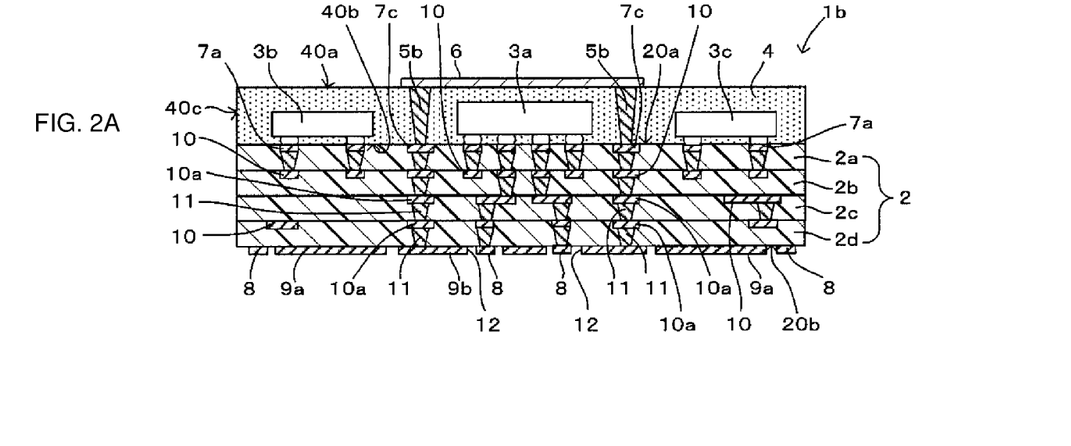
FIGS. 2A and 2B include diagrams illustrating a high frequency module according to a second embodiment of the present disclosure.

A high frequency module 1b according to a second embodiment of the present disclosure will be described with reference to FIGS. 2A and 2B. FIG. 2A is a cross-sectional view of the high frequency module 1b, and FIG. 2B is a bottom view thereof.

Figure 2B:
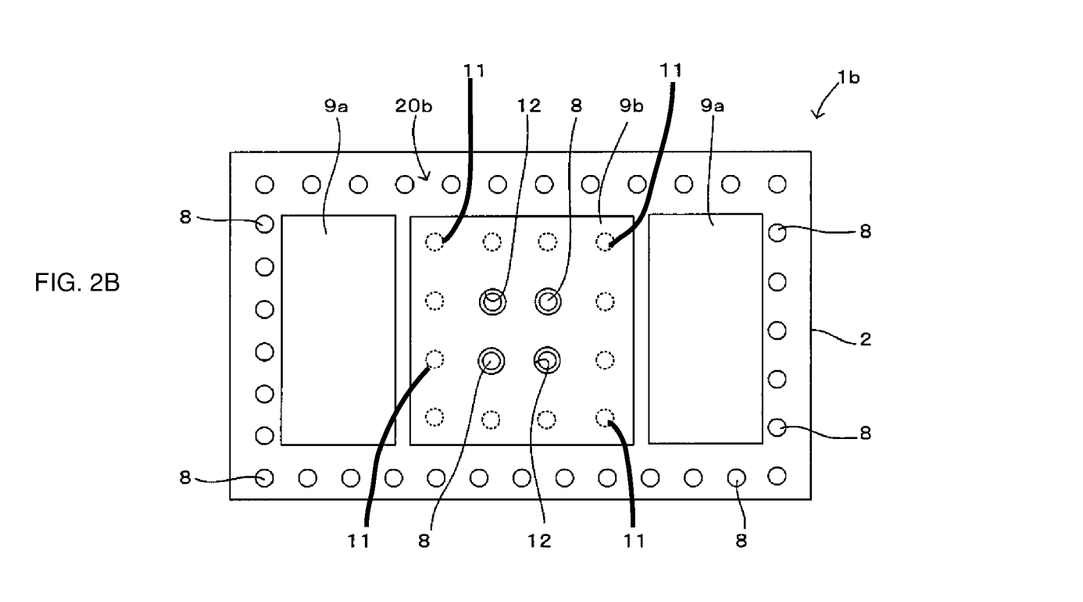

The high frequency module 1b according to the present embodiment differs from the high frequency module 1a of the first embodiment having been described with reference to FIGS. 1A-1C in that, as illustrated in FIGS. 2A and 2B, the configuration of a shield between components is different, the configuration of an electrode formed on a lower surface 20b of a multilayer wiring substrate 2 is different, and the arrangement of an outer electrode is different. Since other configurations are the same as those of the high frequency module 1a of the first embodiment, the same reference signs will be assigned and description thereof will be omitted.

In this case, a shield member surrounding a component 3a is formed of a plurality of via conductors 5b. When viewed from a direction perpendicular to an upper surface 20a of the multilayer wiring substrate 2, the via conductors 5b are arranged in a row along a circumferential edge of a rectangular shield film 6. On the upper surface 20a of the multilayer wiring substrate 2, a plurality of surface layer electrodes 7c is formed at the locations corresponding to the respective via conductors 5b. An upper end of any of the via conductors 5b is exposed from an upper surface 40a of a sealing resin layer 4 and connected to the shield film 6, and a lower end thereof is exposed from a lower surface 40b of the sealing resin layer 4 and connected to the corresponding surface layer electrode 7c.

The via conductors 5b can be formed in the following manner: a plurality of via holes is formed passing through the sealing resin layer 4 in such a manner as to expose the surface layer electrodes 7c from the upper surface 40a of the sealing resin layer 4, and then each of the via holes is filled with a conductive paste, via filling plating is performed on each of the via holes, or the like. For an interval between the adjacent via conductors 5b can be equal to or less than ¼ λ (wave length) of an expected noise frequency. This arrangement makes it possible to enhance the function as a shield achieved by the via conductors 5b. The arrangement of the via conductors 5b may be such that the adjacent via conductors 5b are so arranged as to be in contact with each other without necessarily a gap therebetween. Of the plurality of via conductors 5b, not only four via conductors 5b disposed between the component 3a at the center and a component 3b on the left, and four via conductors 5b disposed between the component 3a at the center and a component 3c on the right, but also the remaining via conductors 5b not disposed between the components form part of a "shield member" of the present disclosure.

As illustrated in FIG. 2B, a new shield electrode 9b is formed on the lower surface 20b of the multilayer wiring substrate 2 in a region thereof overlapping with the component 3a when viewed from a direction perpendicular to the lower surface 20b. The shield electrode 9b of the present embodiment is formed in a rectangular shape having an area larger than that of the component 3a and is disposed so that the component 3a is set within the shield electrode 9b when viewed from the direction perpendicular to the lower surface 20b of the multilayer wiring substrate 2. The size of the shield electrode 9b may be substantially equal to or smaller than the size of the component 3a. In such case, via conductors 11 may be so formed as to be brought closer to the center side of the component 3a. In addition, a plurality of openings 12 is formed in the center of the shield electrode 9b. These openings 12 are formed in a shape larger than that of outer electrodes 8, and some of the outer electrodes 8 are disposed within the openings 12. Similarly to the land electrode 9a, the shield electrode 9b is also connected to a ground electrode of an external mother substrate, and the shield film 6, the shield member (via conductor 5b), the connection conductor, and the shield electrode 9b are grounded.

Any of the plurality of surface layer electrodes 7c connected to the via conductors 5b is connected to the shield electrode 9b via the plurality of via conductors 11 and a plurality of pad electrodes 10a formed in the multilayer wiring substrate 2. In other words, each of the via conductors 5b is connected to the shield electrode 9b via the surface layer electrode 7c, the plurality of via conductors 11, and the plurality of pad electrodes 10a. The plurality of via conductors 11 and the plurality of pad electrodes 10a, which connect each of the surface layer electrodes 7c and the shield electrode 9b, are alternately disposed in the thickness direction of the multilayer wiring substrate 2. The surface layer electrode 7C, and the plurality of via conductors 11 and the plurality of pad electrodes 10a connecting the surface layer electrode 7c and the shield electrode 9b are disposed on a location where all of them substantially overlap each other when viewed from the direction perpendicular to the upper surface 20a of the multilayer wiring substrate 2, so that each of the surface layer electrodes 7c is linearly connected to the shield electrode 9b in the thickness direction of the multilayer wiring substrate 2. Hereinafter, in some cases, a set of the surface layer electrode 7c, the plurality of via conductors 11 and the plurality of pad electrodes 10a, which connect one via conductor 5b to the shield electrode 9b, may be referred to as a connection conductor.

In this case, as illustrated in FIG. 2B, a plurality of connection conductors connecting each of the via conductors 5b and the shield electrode 9b is arranged in a row along a circumferential edge of the shield electrode 9b when viewed from a direction perpendicular to the lower surface 20b of the multilayer wiring substrate 2, and an interval between adjacent connection conductors can be equal to or smaller than ¼ λ (wave length) of an expected noise frequency similarly to the case of the via conductors 5b.

According to this embodiment, in the configuration in which the shield member is formed of the plurality of via conductors 5b, it is possible to obtain the same effects as those in the first embodiment. Moreover, since the component 3a is in a state of being surrounded by the shield film 6, the shield member (via conductors 5b), the shield electrode 9b, and the plurality of connection conductors, it is possible to achieve shielding against noise from all directions, and thus it is possible to improve the shielding characteristics for the component 3a.

In addition, by forming the openings 12 in the shield electrode 9b, some of the outer electrodes 8 can be disposed in the formation region of the shield electrode 9b, thereby making it possible to improve the degree of freedom in arrangement of the outer electrodes 8.

Third Embodiment

Figure 3A:
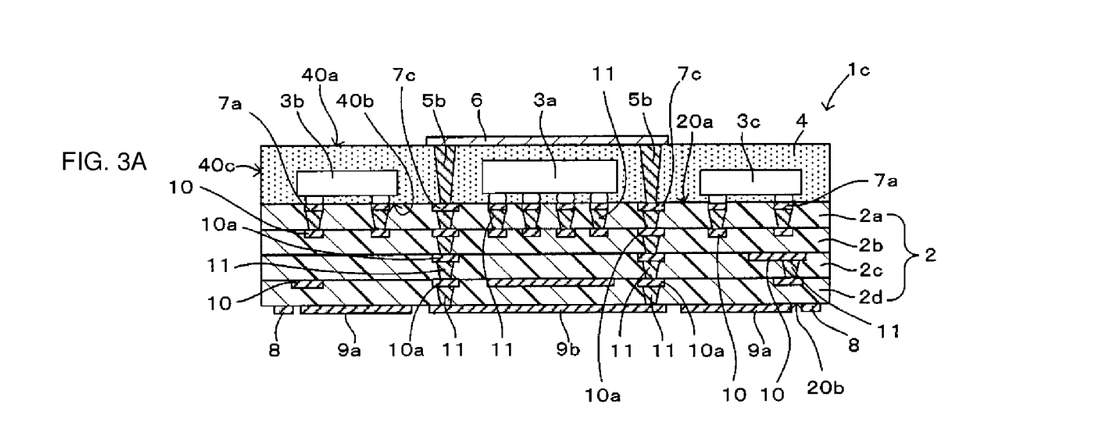
FIGS. 3A and 3B include diagrams illustrating a high frequency module according to a third embodiment of the present disclosure.

A high frequency module 1c according to a third embodiment of the present disclosure will be described with reference to FIGS. 3A and 3B. FIG. 3A is a cross-sectional view of the high frequency module 1c, and FIG. 3B is a bottom view thereof.

Figure 3B:
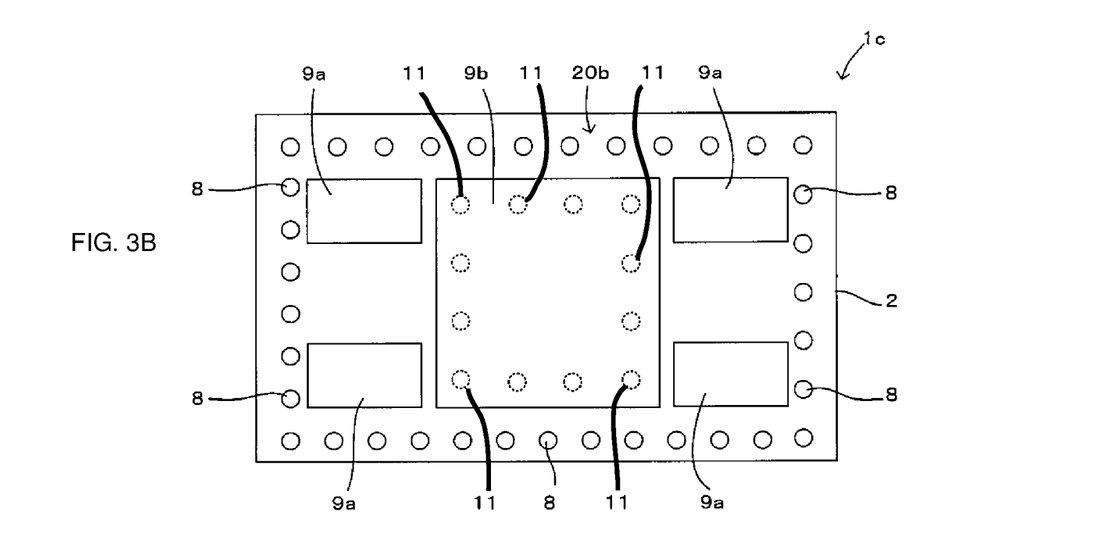

The high frequency module 1c according to the present embodiment differs from the high frequency module 1b of the second embodiment having been described with reference to FIGS. 2A and 2B in that the configuration of a shield electrode is different as illustrated in FIGS. 3A and 3B. Since other configurations are the same as those of the high frequency module 1b of the second embodiment, the same reference signs will be assigned and description thereof will be omitted.

In this case, as illustrated in FIG. 3B, the opening 12 of the second embodiment is not formed in a shield electrode 9b. For example, wiring connected to a component can be extended to the outside through a space between via conductors 11. Two land electrodes 9a having a horizontally-long rectangular shape are formed on each of the right and left sides of the shield electrode 9b at the center.

According to this structure, since the opening 12 is not provided in the shield electrode 9b, a shielding effect of noise coming from a lower surface 20b of a multilayer wiring substrate 2 is enhanced accordingly, thereby making it possible to further improve the shielding characteristics of a component 3a.

Fourth Embodiment

Figure 4A:
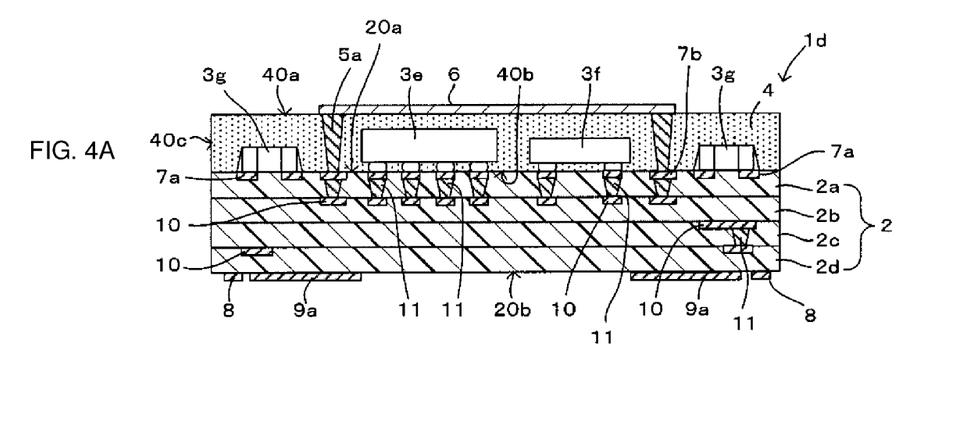
FIGS. 4A and 4B include diagrams illustrating a high frequency module according to a fourth embodiment of the present disclosure.

A high frequency module 1d according to a fourth embodiment of the present disclosure will be described with reference to FIGS. 4A and 4B. FIG. 4A is a cross-sectional view of the high frequency module 1d, and FIG. 4B is a plan view thereof.

Figure 4B:
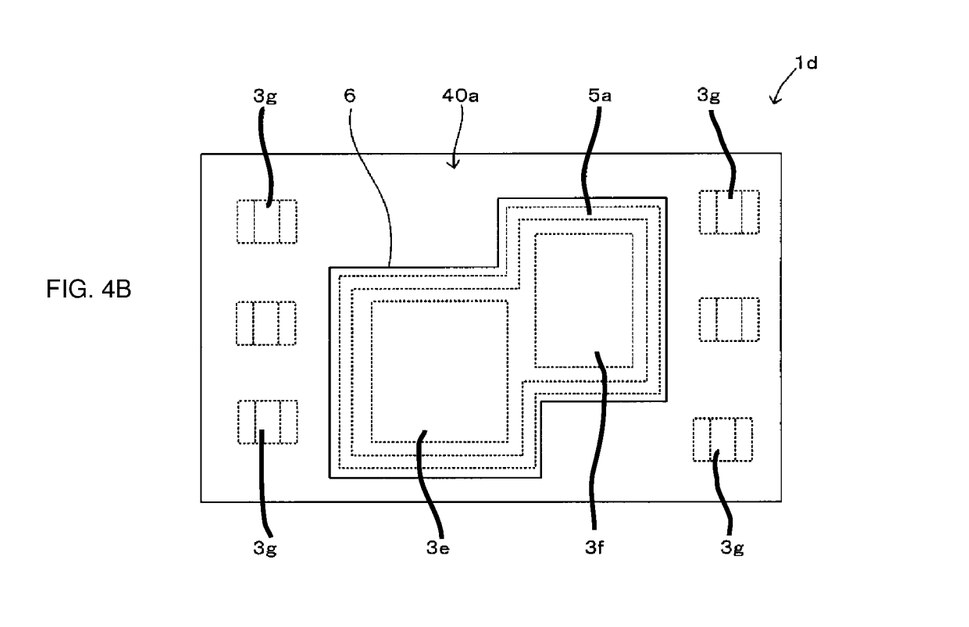

The high frequency module 1d according to the present embodiment differs from the high frequency module 1a of the first embodiment having been described with reference to FIGS. 1A-1C in that the shape of a shield film is different, the shape of a shield wall is different, and the configuration of components is different as illustrated in FIGS. 4A and 4B. Since other configurations are the same as those of the high frequency module 1a of the first embodiment, the same reference signs will be assigned and description thereof will be omitted.

In this case, in a central portion of an upper surface 20a of a multilayer wiring substrate 2, two components 3e and 3f constituted of semiconductor devices are disposed, and a plurality of components 3g such as chip capacitors is disposed on each of the right and left sides of the two components 3e and 3f.

When viewed from a direction perpendicular to the upper surface 20a of the multilayer wiring substrate 2, a shield wall 5a is so formed as to surround the two components 3e and 3f at the center (corresponding to a "first component" and a "third component" of the present disclosure) collectively. In other words, the two components 3e and 3f are disposed in a region surrounded by the shield wall 5a. A shield film 6 covers a region of an upper surface 40a of a sealing resin layer 4 overlapping the two components 3e and 3f but not overlapping the other components 3g when viewed from the direction perpendicular to the upper surface 20a of the multilayer wiring substrate 2.

According to this configuration, it is possible to obtain the same effects as those in the first embodiment even in a case where there exists the plurality of components 3e and 3f that is in need of being shielded.

It should be noted that the present disclosure is not limited to the above-described embodiments, and various modifications can be additionally made without departing from the spirit and scope of the present disclosure. For example, the configurations of the above-described embodiments may be combined with each other.

In the above second and third embodiments, although the case in which the surface layer electrode 7c and the shield electrode 9b are connected by the plurality of via conductors 11 and the plurality of pad electrodes 10a is described, a structure in which only the plurality of via conductors 11 is continuously connected to form a connection conductor without necessarily forming the pad electrode 10a may be employed. Further, it is not necessarily required to linearly connect the surface layer electrode 7c and the shield electrode 9b, and it is sufficient that each surface layer electrode 7c and the shield electrode 9b are connected via wiring electrodes formed on the main surfaces of the insulation layers 2a to 2d and a plurality of via conductors passing through the insulation layers 2a to 2d.

In addition, although, in the above second and third embodiments, the shield member is formed of the plurality of via conductors 5b, the shield member may be formed of a plurality of metal pins instead of the via conductors 5b. In this case, after the metal pins are erectly provided on the surface layer electrodes 7c, the components and the metal pins may be sealed with the sealing resin layer 4. The metal pin can be formed by, for example, shearing a wire rod made of a metal material generally employed as a wiring electrode, such as Cu, Au, Ag, Al, or a Cu-based alloy.

Further, the numbers of insulation layers, wiring layers, and the like constituting the multilayer wiring substrate 2 can be appropriately changed.

INDUSTRIAL APPLICABILITY

The present disclosure is applicable to various types of high frequency modules including a sealing resin layer covering components mounted on a wiring substrate, a shield covering a surface of the sealing resin layer, and a shield for preventing mutual interference of noise between the components.

REFERENCE SIGNS LIST 1a-1d HIGH FREQUENCY MODULE
2 MULTILAYER WIRING SUBSTRATE (WIRING SUBSTRATE)
3a, 3e COMPONENT (FIRST COMPONENT)
3b-3d, 3g COMPONENT (SECOND COMPONENT)
3f COMPONENT (THIRD COMPONENT)
4 SEALING RESIN LAYER
5a SHIELD WALL (SHIELD MEMBER)
5b VIA CONDUCTOR (SHIELD MEMBER)
6 SHIELD FILM
9b SHIELD ELECTRODE
10a PAD ELECTRODE (CONNECTION CONDUCTOR)
11 VIA CONDUCTOR (CONNECTION CONDUCTOR)
12 OPENING

The invention claimed is:

1. A high frequency module comprising:
a wiring substrate;
a first component and a second component mounted on one main surface of the wiring substrate;
a sealing resin layer configured to seal the one main surface of the wiring substrate, the first component, and the second component;
a shield member that is so provided as to surround the first component when viewed from a direction perpendicular to the one main surface of the wiring substrate, and is disposed between the first component and the second component within the sealing resin layer; and
a shield film provided on a surface of the sealing resin layer,
wherein the sealing resin layer includes a contact surface in contact with the one main surface of the wiring substrate and an opposing surface opposing the contact surface,
the shield film is so provided as to cover a portion of the opposing surface of the sealing resin layer that overlaps the first component but not to cover a portion of the opposing surface of the sealing resin layer that overlaps the second component when viewed from the direction perpendicular to the one main surface of the wiring substrate, and
one end of the shield member in a thickness direction of the sealing resin layer is exposed from the opposing surface of the sealing resin layer so that the shield member is connected to the shield film, and other end of the shield member in the thickness direction of the sealing resin layer is exposed from the contact surface of the sealing resin layer so that the shield member is connected to an electrode provided on the one main surface of the wiring substrate,
further comprising:
a shield electrode provided on other main surface of the wiring substrate,
wherein the shield electrode is disposed at a location overlapping with the first component when viewed from the direction perpendicular to the one main surface of the wiring substrate, and
the other end of the shield member is connected to the shield electrode by a connection conductor provided in the wiring substrate,
the shield electrode is separate from other land electrode.

2. The high frequency module according to claim 1, further comprising:
an outer electrode provided on the other main surface of the wiring substrate,
wherein an opening larger than the outer electrode is provided in the shield electrode, and
the outer electrode is disposed in the opening.

3. The high frequency module according to claim 2, further comprising:
a third component mounted on the one main surface of the wiring substrate,
wherein the third component is surrounded together with the first component by the shield member.

4. The high frequency module according to claim 1, further comprising:
a third component mounted on the one main surface of the wiring substrate,
wherein the third component is surrounded together with the first component by the shield member.

* * * * *